United States Patent
Oki

(10) Patent No.: US 9,093,708 B2
(45) Date of Patent: Jul. 28, 2015

(54) METHOD FOR PRODUCING CATHODE ACTIVE MATERIAL LAYER

(75) Inventor: Hideki Oki, Susono (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 978 days.

(21) Appl. No.: 13/260,033

(22) PCT Filed: Jul. 13, 2009

(86) PCT No.: PCT/JP2009/062693
§ 371 (c)(1),
(2), (4) Date: Sep. 23, 2011

(87) PCT Pub. No.: WO2011/007412
PCT Pub. Date: Jan. 20, 2011

(65) Prior Publication Data
US 2012/0015251 A1 Jan. 19, 2012

(51) Int. Cl.
*H01M 4/505* (2010.01)
*H01M 4/525* (2010.01)
(Continued)

(52) U.S. Cl.
CPC .............. *H01M 4/505* (2013.01); *C23C 14/08* (2013.01); *C23C 14/5806* (2013.01);
(Continued)

(58) Field of Classification Search
CPC ............ H01M 4/0421; H01M 4/0423; H01M 4/0428; H01M 4/0471; C23C 14/08; C23C 14/22; C23C 14/228; C23C 14/5806
See application file for complete search history.

(56) References Cited

U.S. PATENT DOCUMENTS

| 2008/0213664 A1 | 9/2008 | Krasnov et al. |
| 2009/0166187 A1 | 7/2009 | Nagase et al. |

FOREIGN PATENT DOCUMENTS

| JP | 09 249962 | 9/1997 |
| JP | 2003 217580 | 7/2003 |

(Continued)

OTHER PUBLICATIONS

Liao, C-L., et al., "Lithium cobalt oxide cathode film prepared by rf sputtering," Journal of Power Sources, vol. 128, pp. 263-269, (2004).

(Continued)

*Primary Examiner* — Edu E Enin-Okut
(74) *Attorney, Agent, or Firm* — Oblon, McClelland, Maier & Neustadt, L.L.P.

(57) ABSTRACT

The main object of the present invention is to provide a method for producing a cathode active material layer, which allows a high-purity lithium complex oxide by restraining impurities from being produced, allows a flat film, and allows orientation control. The present invention solves the above-mentioned problems by providing a method for producing a cathode active material layer, in which a cathode active material layer is formed on a substrate and contains $LiX_aO_b$ (X is a transition metal element of at least one kind selected from the group consisting of Co, Ni and Mn, a=0.7-1.3, and b=1.5-2.5), characterized in that the method comprises the steps of: forming a cathode active material precursor-film on the above-mentioned substrate by a physical vapor deposition method while setting a temperature of the substrate at 300° C. or less, and performing an annealing treatment for the cathode active material precursor-film at a temperature of a crystallizable temperature of the $LiX_aO_b$ or more, and characterized in that the substrate has orientation property in a surface.

5 Claims, 9 Drawing Sheets

(51) Int. Cl.
  *C23C 14/08* (2006.01)
  *C23C 14/58* (2006.01)
  *H01M 4/04* (2006.01)
  *H01M 4/131* (2010.01)
  *H01M 10/0562* (2010.01)
  *H01M 4/02* (2006.01)

(52) U.S. Cl.
  CPC ......... *H01M 4/0423* (2013.01); *H01M 4/0471* (2013.01); *H01M 4/131* (2013.01); *H01M 4/525* (2013.01); *H01M 10/0562* (2013.01); *H01M 2004/021* (2013.01); *H01M 2004/028* (2013.01); *Y02E 60/122* (2013.01)

(56) References Cited

FOREIGN PATENT DOCUMENTS

| | | |
|---|---|---|
| JP | 2003 234100 | 8/2003 |
| JP | 2005 243371 | 9/2005 |
| JP | 2008 045213 | 2/2008 |
| WO | 2008 012970 | 1/2008 |

OTHER PUBLICATIONS

Bates, J. B., et al., "Preferred Orientation of Polycrystalline $LiCoO_2$ Films," Journal of the Electrochemical Society, vol. 147, No. 1, pp. 59-70, (Jan. 2000) (Abstract only).

International Search Report Issued Oct. 6, 2009 in PCT/JP09/062693 Filed Jul. 13, 2009.

(003)  (101)  (104)

Com. Ex.: Substrate Temperature During Deposition
Ex.: Post-Annealing Temperature

METHOD FOR PRODUCING CATHODE ACTIVE MATERIAL LAYER

TECHNICAL FIELD

The present invention relates to a method for producing a cathode active material layer used for a lithium battery.

BACKGROUND ART

In accordance with a rapid spread of information relevant apparatuses and communication apparatuses such as a personal computer, a video camera and a portable telephone in recent years, the development of a battery excellent as a power source thereof (such as a lithium battery) has been emphasized. The development of a lithium battery used for an electric automobile or a hybrid automobile has been advanced, for example, in the automobile industry in the field other than information relevant apparatuses and communication relevant apparatuses.

Here, organic liquid electrolyte using a flammable organic solvent is used for a conventionally commercialized lithium battery, so that the installation of a safety device for restraining temperature rise during a short circuit and the improvement in structure and material for preventing the short circuit are necessary therefor. On the contrary, with regard to an all solid battery having a liquid electrolyte replaced with a solid electrolyte, the flammable organic solvent is not used in the battery. Accordingly, it can attain the simplification of the safety device and is thereby conceived to be excellent in production cost and productivity A method for forming a lithium complex oxide such as $LiCoO_2$ into a film by using a physical vapor deposition (PVD) method such as a sputtering method and a vacuum deposition method has been conventionally known as a method for forming a cathode active material layer of a lithium battery (refer to Patent Literature 1 and Patent Literature 2, for example). On this occasion, it has been known that the heating of a substrate to high temperature during film format ion allows a crystallized lithium complex oxide film.

CITATION LIST

Patent Literature

Patent Literature 1: Japanese Patent Application Publication No. 2003-234100
Patent Literature 2: Japanese Patent Application Publication No. 2008-45213

Non Patent Literature

Non Patent Literature 1: J. Electrochem. Soc., 147 59 (2000)

SUMMARY OF INVENTION

Technical Problem

However, when a substrate is heated to high temperature during film formation, Li is evaporated so easily as to be evaporated even though accumulated on the substrate, and Li is lost more than a stoichiometric ratio to produce impurities such as $CO_3O_4$. Thus, the case where the obtained cathode active material layer is used for a lithium battery brings a possibility of causing a decrease in capacity and a decrease in output.

A cathode active material layer formed by a PVD method such as a sputtering method causes a crack on a surface after an annealing treatment so easily as to be inferior in surface flatness (FIG. 11: SEM photograph of J. Electrochem. Soc., 147 59 (2000)). Thus, when an all solid lithium secondary battery is produced by using such a cathode active material layer, a solid electrolyte layer needs to be formed thickly on the cathode active material layer and the problem is that the capacity of the battery decreases.

In addition, it has been known that a lithium complex oxide with a layered-crystal structure such as $LiCoO_2$ has anisotropy in electric resistivity, and it is difficult to perform orientation control in consideration of characteristics of the device in a PVD method such as a sputtering method. Thus, the obtained cathode active material layer increases in resistance so much as to bring a possibility of decreasing in output.

The present invention has been made in view of the above-mentioned problems, and the main object thereof is to provide a method for producing a cathode active material layer, which allows a high-purity lithium complex oxide by restraining impurities from being produced, allows a flat film, and allows orientation control.

Solution to Problem

To solve the problem, the present invention provides a method for producing a cathode active material layer, in which a cathode active material layer is formed on a substrate and contains $LiX_aO_b$ (X is a transition metal element of at least one kind selected from the group consisting of Co, Ni and Mn, a=0.7-1.3, and b=1.5-2.5); characterized in that the method comprises the steps of: forming a cathode active material precursor-film on the substrate by a physical vapor deposition method while setting a temperature of the substrate at 300° C. or less; and performing an annealing treatment for the cathode active material precursor-film at a temperature of a crystallizable temperature of the $LiX_aO_b$ or more; and characterized in that the substrate has an orientation property in a surface.

According to the present invention, the annealing treatment is performed after forming a cathode active material precursor-film without heating a substrate to high temperature during the formation of the cathode active material precursor-film, so that a cathode active material layer containing high-purity $LiX_aO_b$ may be obtained while restraining impurities such as $CO_3O_4$ from being produced. Also, according to the present invention, the performance of the annealing treatment improves flatness of the cathode active material precursor-film formed by a PVD method to allow a cathode active material layer with favorable flatness. In addition, the use of a substrate having an orientation property in a surface allows a cathode active material layer, such that the "c" axis of $LiX_aO_b$ is inclined against the normal line of the substrate, to be formed. Accordingly, in the case where a lithium battery is offered by using the cathode active material layer obtained by a method for producing a cathode active material layer of the present invention, large capacity and high output may be intended.

In the present invention, a rate of temperature rise in the annealing treatment is preferably 20° C./min or more. The reason therefor is that a cathode active material layer with high crystallinity may be obtained.

Also, in the present invention, a target such that Li is more excessive than a stoichiometric composition ratio between Li and X is preferably used in forming the cathode active material precursor-film by the physical vapor deposition method.

Similarly to the above-mentioned case, the reason therefor is that a cathode active material layer with high crystallinity may be obtained.

Furthermore, in the present invention, the cathode active material layer such that a "c" axis of the $LiX_aO_b$ is inclined against a normal line of the substrate is preferably formed. The reason therefor is that a cathode active material layer with low resistance may be obtained.

Also, in the present invention, a crystal orientation of the substrate is preferably (110). The reason therefor is that the inclination of the "c" axis of $LiX_aO_b$ against the normal line of the substrate may be made a desired inclination more effectively and the resistance of a cathode active material layer may be decreased further.

Also, the present invention provides a method for producing an all solid lithium secondary battery, in which an all solid lithium secondary battery comprises: a cathode active material layer, an anode layer, and a solid electrolyte layer formed between the cathode active material layer and the anode layer; characterized in that the method comprises a cathode active material layer forming step of forming the cathode active material layer by the method for producing a cathode active material layer according to any one of the above-mentioned embodiments.

According to the present invention, the formation of a cathode active material layer by the above-mentioned method for producing a cathode active material layer allows a large-capacity and high-output all solid lithium secondary battery.

Furthermore, the present invention provides a cathode body comprising: a substrate having an orientation property in a surface, and a cathode active material layer formed on the substrate and containing $LiX_aO_b$ (X is a transition metal element of at least one kind selected from the group consisting of Co, Ni and Mn, a=0.7-1.3, and b=1.5-2.5); characterized in that a "c" axis of the $LiX_aO_b$ is inclined against a normal line of the substrate; and a surface roughness (Ra) of the cathode active material layer is 5 nm or less.

According to the present invention, the "c" axis of $LiX_aO_b$ is inclined against the normal line of the substrate, so that the resistance of a cathode active material layer may be decreased. A cathode active material layer is so excellent in flatness that the thickness of an all solid electrolyte layer may be thinned in being used for an all solid lithium secondary battery. Accordingly, capacity increase and output improvement of an all solid lithium secondary battery may be intended.

In the present invention, a crystal orientation of the substrate is preferably (110). The reason therefor is that the inclination of the "c" axis of $LiX_aO_b$ against the normal line of the substrate may be made a desired inclination more effectively and the resistance of a cathode active material layer may be decreased further.

Advantageous Effects of Invention

In the present invention, an annealing treatment is performed after forming a cathode active material precursor-film without heating a substrate to high temperature during the formation of the cathode active material precursor-film and the substrate having an orientation property in a surface is used, so that the effect such as to allow a high-purity and flat cathode active material layer with orientation controlled while restraining impurities from being produced is produced.

DESCRIPTION OF EMBODIMENTS

Figure 1A:
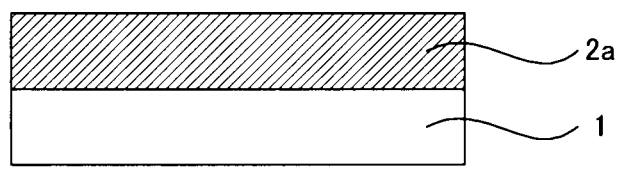
FIGS. 1A and 1B are each a process drawing showing an example of a method for producing a cathode active material layer of the present invention.

A method for producing a cathode active material layer, a method for producing an all solid lithium secondary battery and a cathode body of the present invention are hereinafter described in detail.

A. Method for Producing Cathode Active Material Layer

A method for producing a cathode active material layer of the present invention is a method for producing a cathode active material layer, in which a cathode active material layer is formed on a substrate and contains $LiX_aO_b$ (X is a transition metal element of at least one kind selected from the group consisting of Co, Ni and Mn, a=0.7-1.3, and b=1.5-2.5), characterized in that the method comprises the steps of: forming a cathode active material precursor-film on the above-mentioned substrate by a physical vapor deposition method while setting a temperature of the above-mentioned substrate at 300° C. or less, and performing an annealing treatment for the above-mentioned cathode active material precursor-film at a temperature of a crystallizable temperature of the above-mentioned $LiX_aO_b$ or more; and characterized in that the above-mentioned substrate has an orientation property in a surface.

A method for producing a cathode active material layer of the present invention is described while referring to the drawings.

Figure 1B:
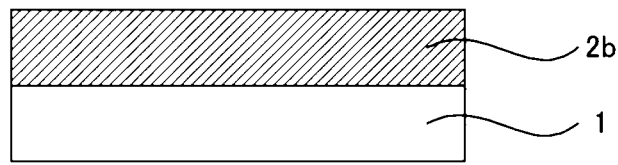

FIGS. 1A and 1B are each a process drawing showing an example of a method for producing a cathode active material layer of the present invention. First, a temperature of a substrate 1 having an orientation property in a surface is set at 300° C. or less to form a cathode active material precursor-film $2a$ on the substrate 1 by a physical vapor deposition method (FIG. 1A, cathode active material precursor-film forming step). Next, an annealing treatment is performed for the cathode active material precursor-film $2a$ at a temperature of a crystallizable temperature of $LiX_aO_b$ or more to form a cathode active material layer $2b$ (FIG. 1B, annealing treatment step).

According to the present invention, the annealing treatment is performed after forming a cathode active material precursor-film without heating a substrate to high temperature during the formation of the cathode active material precursor-film, so that high-purity $LiX_aO_b$ with less impurities may be obtained while restraining loss of Li caused by evaporation of Li accumulated on the substrate and restraining impurities such as $CO_3O_4$ from being produced. Also, according to the present invention, the annealing treatment is performed after forming the cathode active material precursor-film by a PVD method, so that a cathode active material layer with favorable flatness may be obtained. As described above, in the case where a cathode active material layer is formed by using a PVD method such as a sputtering method, a film inferior in flatness is obtained; however, the performance of the annealing treatment may improve flatness. In addition, according to the present invention, the use of a substrate having an orientation property in a surface allows a crystal to be grown while utilizing an orientation property of the substrate and controlling nucleus formation of $LiX_aO_b$. Therefore, the "c" axis of $LiX_aO_b$ may be inclined against the normal line of the substrate. Thus, a cathode active material layer with favorable Li ion conductivity and low resistance may be obtained. Accordingly, in the case where a lithium battery is offered by using the cathode active material layer obtained by a method for producing a cathode active material layer of the present invention, large capacity and high output are allowed.

Each step in a method for producing a cathode active material layer of the present invention is described hereinafter.

1. Cathode Active Material Precursor-Film Forming Step

Cathode active material precursor-film forming step in the present invention is a step of setting a temperature of a substrate having an orientation property in a surface at 300° C. or less to form a cathode active material precursor-film on the above-mentioned substrate by a physical vapor deposition method.

A physical vapor deposition (PVD) method used for the present invention is not particularly limited if it is a method capable of forming a cathode active material precursor-film as a precursor of a cathode active material layer containing $LiX_aO_b$, and general PVD methods such as a sputtering method and a vacuum deposition method may be adopted. Above all, a pulsed laser deposition (PLD) method is preferable. The reason therefor is that a minute cathode active material precursor-film with almost no grain boundary may be formed.

The PLD method is generally a method for intermittently irradiating a target in a vacuum chamber with a pulsed laser to thereby ablate the target and accumulate an emitted fragment (ion, cluster, molecule and atom) on a substrate.

Kinds of the laser used in the PLD method are not particularly limited; examples thereof include an excimer laser such as a KrF excimer laser (a wavelength of 248 nm) and a YAG laser such as an Nd-YAG laser (4HD, a wavelength of 266 nm). The energy density of the laser is preferably, for example, within a range of 150 mJ/cm² to 1000 mJ/cm², and above all, within a range of 500 mJ/cm² to 1000 mJ/cm². The repetition frequency of the laser is preferably, for example, within a range of 2 Hz to 10 Hz, and above all, within a range of 5 Hz to 10 Hz. Examples of the atmosphere of the vacuum chamber during film formation include oxygen ($O_2$). The pressure of the vacuum chamber during film formation is preferably, for example, 30 Pa or less. Generally, the control of the film-forming time allows the thickness of a cathode active material precursor-film to be controlled.

The target used in the PVD method is properly selected in accordance with the composition of intended $LiX_aO_b$. For example, in the case of regarding $LiCoO_2$ as an objective substance, $LiCoO_2$ may be used and a combination of Li metal and a substance containing not Li but Co may be used. Above all, the target such that Li is more excessive than a stoichiometric composition ratio between Li and X in the intended $LiX_aO_b$ is preferably used. The reason therefor is that Li is evaporated easily but the use of the target with excessive Li causes Li to be emitted during film formation so excessively as to allow a cathode active material layer with high crystallinity after the annealing treatment.

The temperature of a substrate may be 300° C. or less and preferably 200° C. or less. Too high substrate temperature progresses crystallization to deteriorate film quality. In the present invention, the performance of the annealing treatment for an amorphous solid electrolyte precursor film allows a crystalline solid electrolyte layer, so that the temperature of a substrate is preferably a temperature for allowing the amorphous solid electrolyte precursor film. Also, too high substrate temperature causes impurities such as $CO_3O_4$ to be easily produced. It is conceived that once impurities such as $CO_3O_4$ are produced during the formation of a cathode active material precursor-film, no Li is supplied again in the annealing treatment, so that no $LiX_aO_b$ is produced from impurities such as $CO_3O_4$, which still remains as the impurities. In addition, it is conceived that impurities such as $CO_3O_4$ start being produced in the vicinity of an interface between a substrate and a cathode active material precursor-film and the impurities still remain for the reason that no Li is supplied to this interface between the substrate and the cathode active material precursor-film in the annealing treatment. Also, lower substrate temperature allows flatness of a cathode active material precursor-film to be improved more. Therefore, the temperature of a substrate is preferably a predetermined temperature or less.

Lower substrate temperature is preferable because Li accumulated on a substrate is evaporated with more difficulty and lower substrate temperature may further retrain impurities from being produced. The lower limit of the substrate temperature is not particularly limited and yet preferably 25° C. or more in consideration of apparatus and equipment.

The substrate may be previously heated before cathode active material precursor-film forming step. The preheating temperature of the substrate is preferably 500° C. or more.

The substrate used for the present invention has an orientation property in a surface. The utilization of an orientation property of the substrate allows the "c" axis of $LiX_aO_b$ to be inclined against the normal line of the substrate. Thus, Li ion conductivity may be improved to decrease the resistance of a cathode active material layer.

The term 'Orientation property' signifies a property such that a crystal may be grown while controlling nucleus formation of $LiX_aO_b$ on a substrate surface.

Figure 2A:
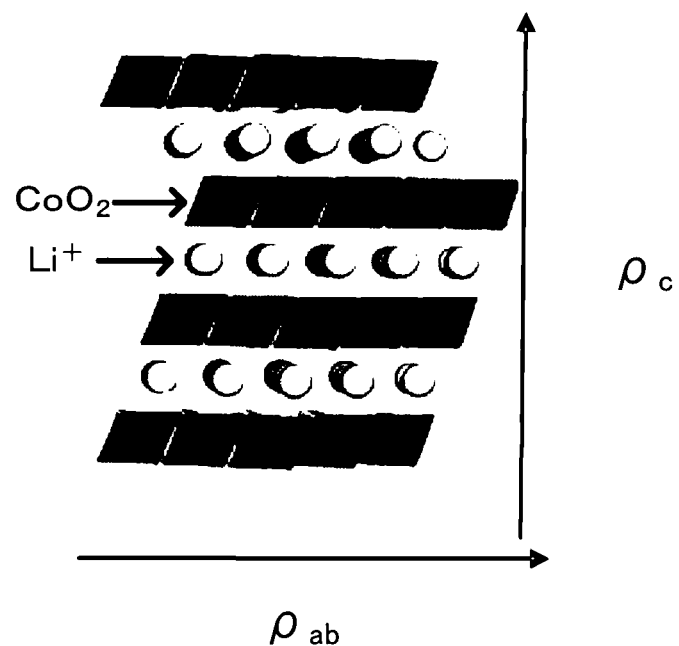
FIGS. 2A and 2B are a schematic view showing a crystal structure of $LiCoO_2$ in the present invention and a graph showing crystal anisotropy of resistance of $LiCoO_2$ in the present invention.
Figure 2B:
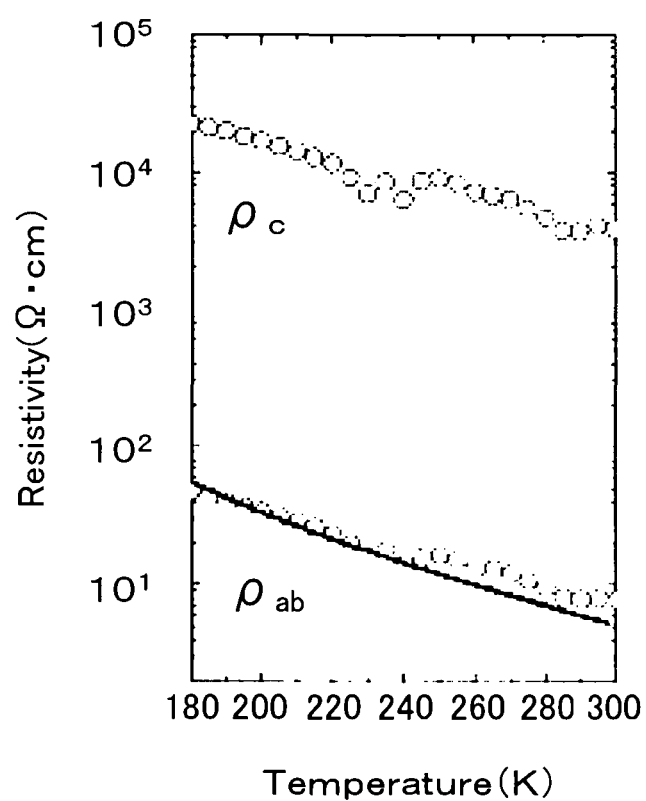

$LiX_aO_b$ (X is a transition metal element of at least one kind selected from the group consisting of Co, Ni and Mn, a=0.7-1.3, and b=1.5-2.5) generally has a layered-crystal structure, that is, a laminated structure in which a lithium ion ($Li^+$) enters into an $X_aO_b$ layer composed of a transition metal atom and an oxygen atom. In such a laminated structure, an axis orthogonal to a layer with $Li^+$ arrayed and the $X_aO_b$ layer and an axis parallel to a layer with Li$^x$ arrayed and the X$_a$O$_b$ layer are called the "c" axis and the "ab" axis, respectively. When electric resistivity of the "c" axis and electric resistivity of the "ab" axis are regarded as $\rho_c$ and $\rho_{ab}$ respectively, it has been known that electric resistivity has anisotropy. In the case where electric resistivity is represented as a function of temperature, the electric resistivity $\rho_c$ is high by as many as several digits as compared with the electric resistivity $\rho_{ab}$. For example, LiCoO$_2$ has a layered-crystal structure as generally shown in FIG. 2A, that is, a laminated structure in which a lithium ion (Li$^+$) enters into a CoO$_2$ layer composed of a cobalt atom and an oxygen atom. As shown in FIG. 2B, in the case where electric resistivity is represented as a function of temperature, the electric resistivity $\rho_c$ is high by as many as several digits as compared with the electric resistivity $\rho_{ab}$. Thus, the "ab" axis with low electric resistivity and the normal line of the substrate may be approximated to parallel by inclining the "c" axis of LiX$_a$O$_b$ against the normal line of the substrate, so that electric resistivity may be decreased to decrease the resistance of a cathode active material layer.

Figure 3:
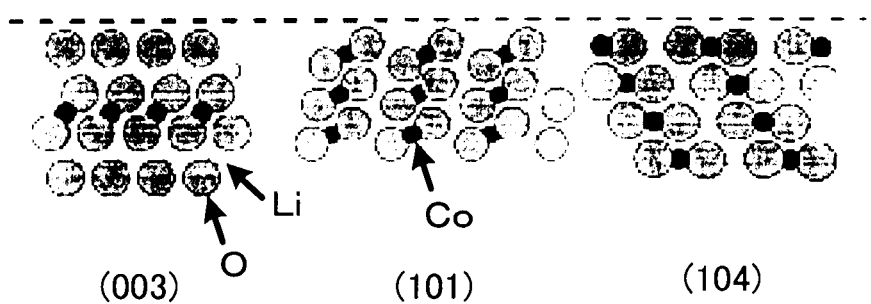
FIG. 3 is a schematic view showing crystal orientation of $LiCoO_2$ in the present invention.

FIG. 3 is a schematic view of LiCoO$_2$ crystal cross section accumulated on a substrate for describing crystal orientation of LiCoO$_2$ accumulated on a predetermined substrate. As shown in FIG. 3, when the peaks of (101) and (104) analyzable by an X-ray diffraction method (XRD) are rendered stronger, the "c" axis of LiCoO$_2$ may be inclined more against the normal line of the substrate. That is to say, the "ab" axis with low electric resistivity may be arrayed so closer to the normal line direction that the resistance of a cathode active material layer may be decreased. On the other hand, when the peak of (003) analyzable by XRD is rendered stronger, the "c" axis is arrayed in the normal line direction of the substrate, so that the resistance of a cathode active material layer is increased more.

The substrate is not particularly limited if it has an orientation property in a surface, may form a cathode active material precursor-film by using a physical vapor deposition method, and is resistible to the after-mentioned annealing treatment. Examples thereof include a cathode current collector having an orientation property in a surface and a cathode current collector on which an orientation layer having an orientation property is formed. Examples of the cathode current collector having an orientation property in a surface include a cathode current collector having specific crystal orientation. Also, an orientation property may be provided in such a manner that a cathode current collector having no orientation property is irradiated with an ion beam or an electron beam by a gas phase method to form irregularities. On the other hand, in the case where an orientation layer is formed on a cathode current collector, the orientation layer and the cathode current collector may be composed of different materials, and an orientation layer may be formed on a cathode current collector by a deposition method.

The above-mentioned substrate preferably has specific crystal orientation. The crystal orientation may be a crystal orientation such as to allow a desired cathode active material layer, and is not particularly limited by reason of possibly varying with forming conditions of a cathode active material precursor-film and annealing temperature. Specifically, the crystal orientation is preferably any one selected from the group consisting of (100), (111) and (110). The reason therefor is that the "c" axis of LiX$_a$O$_b$ is inclined more against the normal line of the substrate and the "ab" axis with low electric resistivity may be at an angle close to parallel to the normal line and a portion capable of giving and receiving an Li ion is formed more securely on a cathode active material layer surface, so that Li ion conductivity may be improved to decrease the resistance of a cathode active material layer. Above all, the crystal orientation is preferably (111) and (110), and particularly preferably (110). The reason therefor is that Li ion conductivity may be improved more effectively to decrease the resistance of a cathode active material layer.

Also, the above-mentioned substrate preferably has a tetragonal crystal structure. The reason therefor is that lattice constant difference from LiCoO$_2$ is small.

Figure 4A:
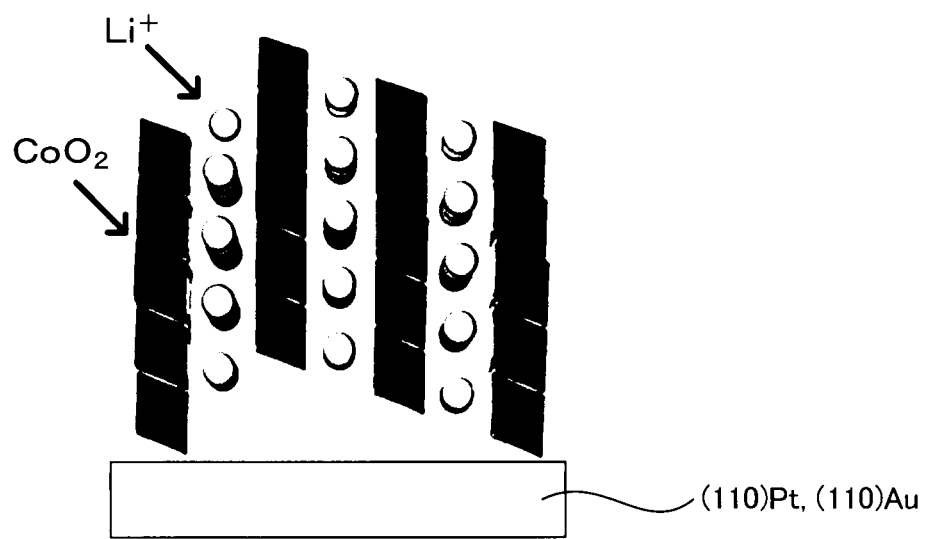
FIGS. 4A and 4B are each a schematic view showing crystal orientation of a substrate and $LiCoO_2$ in the present invention.
Figure 4B:
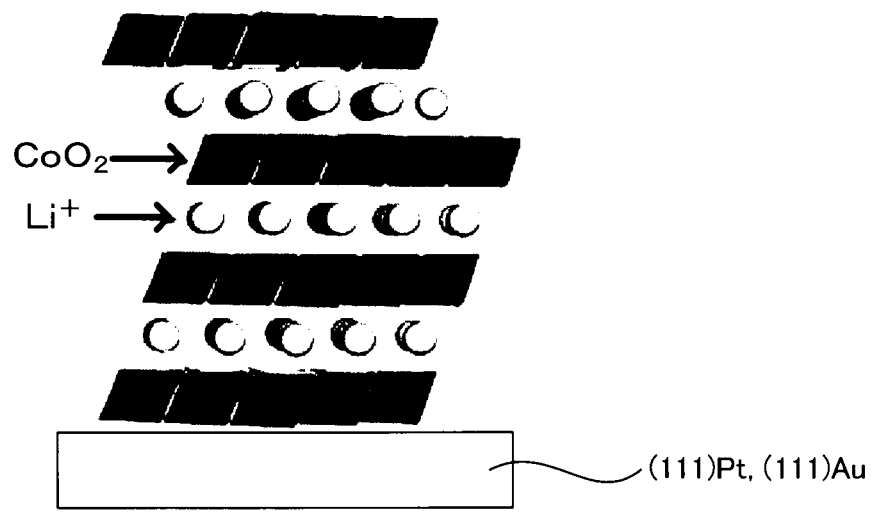

The cathode current collector has the function of performing current collection of a cathode active material layer. The cathode current collector used as the substrate may have the function of the cathode current collector; for example, a metallic foil and a metal plate may be used. Examples of the cathode current collector having specific crystal orientation include a Pt substrate, a c-Al$_2$O$_3$ substrate, an Au substrate and a SrTiO$_3$ substrate. These substrates may be a monocrystalline substrate or a polycrystalline substrate. Specifically, as shown in FIG. 4A, in the case of using a (110) Pt substrate and a (110) Au substrate, the "c" axis of LiCoO$_2$ is inclined more against the normal line of the substrate and the "ab" axis with low electric resistivity may be at an angle close to parallel to the normal line. On the other hand, as shown in FIG. 4B, in the case of using a (111) Pt substrate and a (111) Au substrate, the "c" axis of LiCoO$_2$ is at an angle close to parallel to the normal line of the substrate. Also, examples of the cathode current collector having a tetragonal crystal structure include a Pt substrate and an Au substrate.

2. Annealing Treatment Step

An annealing treatment step in the present invention is a step of performing an annealing treatment for the above-mentioned cathode active material precursor-film at a temperature of a crystallizable temperature of LiX$_a$O$_b$ or more.

The term 'Crystallizable temperature of LiX$_a$O$_b$' signifies a temperature at which a LiX$_a$O$_b$ crystal phase may be precipitated. In the case where a cathode active material precursor-film is formed by a method for irradiating a target of a PLD method with a laser, variation occasionally occurs in Li concentration in the film. When Li is not uniformly distributed in the film, a LiX$_a$O$_b$ crystal phase is occasionally precipitated at a temperature lower than a crystallizable temperature of LiX$_a$O$_b$. For example, it is conceived that more excessive Li concentration in the film than a stoichiometric ratio causes crystallization at a temperature lower than a crystallizable temperature of LiX$_a$O$_b$. Thus, in the present invention, annealing temperature is set at a crystallizable temperature of LiX$_a$O$_b$ or more. Specifically, a crystallizable temperature of LiX$_a$O$_b$ is preferably a crystallization temperature of LiX$_a$O$_b$ of −50° C.

The annealing temperature may be a temperature of a crystallizable temperature of LiX$_a$O$_b$ or more, and is properly selected in accordance with the composition of intended Li X$_a$O$_b$. For example, in the case of LiCoO$_2$, the annealing temperature is preferably 200° C. or more. Above all, the annealing temperature is preferably 500° C. or more, more preferably within a range of 500° C. to 800° C., and far more preferably within a range of 500° C. to 700° C. In LiX$_a$O$_b$, the reason therefor is that: when X is located in an Li site or Li is located in an X site, there is a possibility that an Li ion is not conducted, but yet annealing temperature of 500° C. or more allows Li and X to be correctly located in the Li site and the X site respectively, and allows a homogeneous LiX$_a$O$_b$ crystal phase to be obtained. Also, the reason therefor is that too high annealing temperature brings a possibility of causing decomposition of LiX$_a$O$_b$.

The retention time for retaining at the above-mentioned annealing temperature is not particularly limited if it is the time up to precipitation of a LiX$_a$O$_b$ crystal phase. Specifically, the retention time is preferably 5 minutes or more, above all, within a range of 10 minutes to 120 minutes, and particularly, within a range of 30 minutes to 60 minutes. The reason therefor is that too short retention time brings a possibility that a homogeneous $LiX_aO_b$ crystal phase is not obtained.

The rate of temperature rise in the annealing treatment is not particularly limited if the annealing treatment allows a $LiX_aO_b$ crystal phase, and is preferably 20° C./min or more, and particularly, 100° C./min or more. The reason therefor is that crystallinity of $LiX_aO_b$ may be improved. Higher rate of temperature rise is more preferable, so that the upper limit of the rate of temperature rise is not particularly limited and yet is preferably 200° C./min or less from the viewpoint of uniformly distributing temperature in the film.

The atmosphere in performing the annealing treatment is not particularly limited if it is an atmosphere such as to allow an $LiX_aO_b$ crystal phase, and is generally an oxidizing atmosphere. Examples thereof include an aerial atmosphere. Above all, low water concentration is preferable. The reason therefor is that Li reacts easily with water.

Pressure is preferably applied during the annealing treatment. The reason therefor is that Li may be restrained from evaporating. Examples of the pressure include atmospheric pressure, preferably larger than atmospheric pressure, above all.

The number of the annealing treatments is preferably one time, that is, a temperature rise to an intended annealing temperature at one stage is preferable. The reason therefor is that crystallinity of $LiX_aO_b$ may be improved.

In the present invention, the use of a substrate having an orientation property in a surface allows a crystal to be grown through the annealing treatment step while utilizing an orientation property of the substrate surface and controlling nucleus formation of $LiX_aO_b$. Thus, a $LiX_aO_b$ crystal phase such that the "c" axis of $LiX_aO_b$ is inclined against the normal line of the substrate may be obtained and a cathode active material layer with low resistance may be obtained.

3. Cathode Active Material Layer

In the present invention, a cathode active material layer containing $LiX_aO_b$ (X is a transition metal element of at least one kind selected from the group consisting of Co, Ni and Mn, a=0.7-1.3, and b=1.5-2.5) is formed on a substrate.

Specific examples of $LiX_aO_b$ include $LiCoO_2$, $LiMnO_2$, $LiNiO_2$, and $LiNi_{1/3}Co_{1/3}Mn_{1/3}O_2$.

As described above, in the present invention, a cathode active material layer such that the "c" axis of $LiX_aO_b$ is inclined against the normal line of the substrate is preferably formed. The reason therefor is to allow a cathode active material layer with low resistance.

Examples of the use of a cathode active material layer include a use for a lithium battery. The lithium battery may be a primary battery or a secondary battery, and preferably a secondary battery, above all. The reason therefor is to be capable of being charged and discharged repeatedly and be useful as a vehicle battery.

B. Method for Producing all Solid Lithium Secondary Battery

A method for producing an all solid lithium secondary battery of the present invention is a method, in which an all solid lithium secondary battery comprises: a cathode active material layer, an anode layer, and a solid electrolyte layer formed between the above-mentioned cathode active material layer and the above-mentioned anode layer, characterized in that the method comprises a cathode active material layer forming step of forming the above-mentioned cathode active material layer by the above-mentioned method for producing a cathode active material layer.

According to the present invention, the above-mentioned cathode active material layer is formed by the above-mentioned method for producing a cathode active material layer, so that a flat cathode active material layer, with orientation controlled and containing high-purity $LiX_aO_b$, may be obtained while restraining impurities such as $CO_3O_4$ from being produced, and a large-capacity and high-output all solid lithium secondary battery may be produced.

Figure 5A:
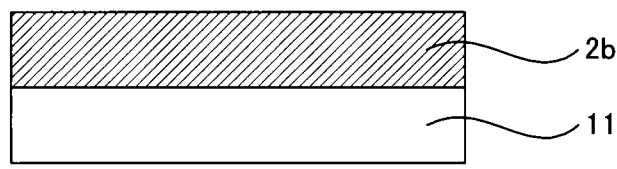
FIGS. 5A to 5D are a process drawing showing an example of a method for producing an all solid lithium secondary battery of the present invention.
Figure 5B:
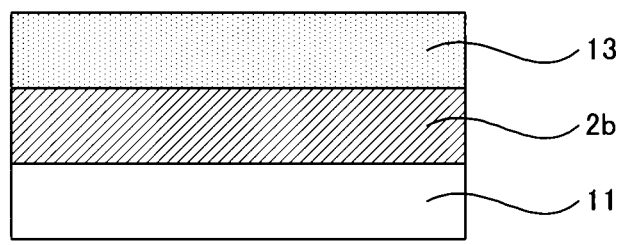
Figure 5C:
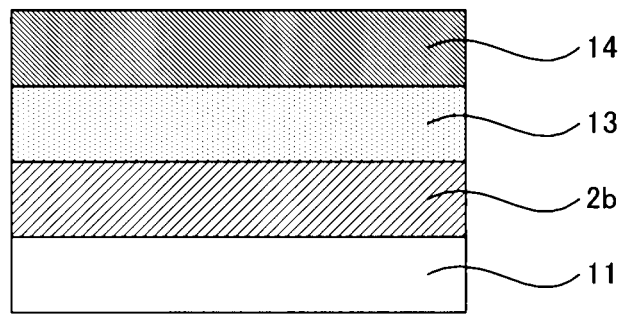
Figure 5D:
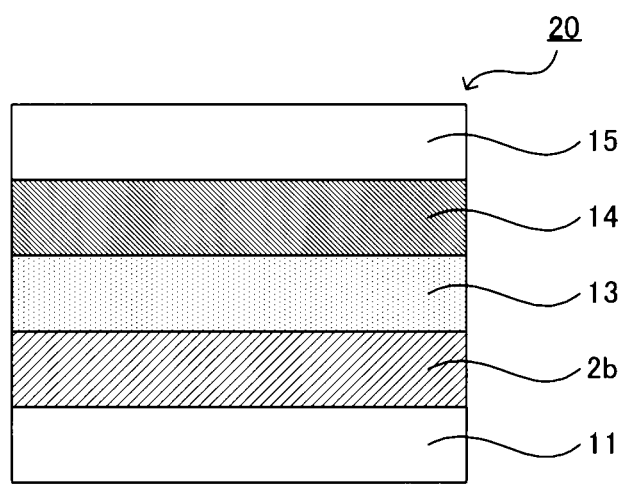

FIGS. 5A to 5D are a process drawing showing an example of a method for producing an all solid lithium secondary battery of the present invention, and is an example of the case where a cathode current collector is used as a substrate. In the producing method in FIGS. 5A to 5D, first, a cathode active material layer 2b is formed on a cathode current collector 11 (substrate) by the above-mentioned method for producing a cathode active material layer (FIG. 5A). Next, a solid electrolyte material is added and pressed on a surface of the cathode active material layer 2b to thereby form a solid electrolyte layer 13 (FIG. 5B). Then, an anode active material is disposed and pressed on a surface of the solid electrolyte layer 13 to thereby form an anode layer 14 (FIG. 5C). Subsequently, an anode current collector 15 is disposed on a surface of the anode layer (FIG. 5D). Thus, a power generating element 20 comprising the cathode current collector 11, the cathode active material layer 2b, the solid electrolyte layer 13, the anode layer 14 and the anode current collector 15 may be obtained. Lastly, this power generating element 20 is stored inside a battery outer case, which is crimped to thereby allow an all solid lithium secondary battery.

The order of forming each layer of the power generating element is not particularly limited if it is through cathode active material layer forming step of forming a cathode active material layer on a substrate, and yet an optional order may be adopted. Plural layers composing the power generating element may be formed simultaneously.

Cathode active material layer forming step is the same as is described in the section of the above-mentioned 'A. Method for producing cathode active material layer'; therefore, the description herein is omitted. Other steps in a method for producing an all solid lithium secondary battery of the present invention are described hereinafter.

1. Solid Electrolyte Layer Forming Step

In the present invention, solid electrolyte layer forming step of forming a solid electrolyte layer by using a solid electrolyte material is generally performed. In the present invention, in the case where the substrate is a cathode current collector, solid electrolyte layer forming step is performed after cathode active material layer forming step.

The solid electrolyte material may be such as to be capable of resisting the above-mentioned annealing treatment, and an oxide-based solid electrolyte material is preferably used.

Examples of a method for forming a solid electrolyte layer include a press method. The thickness of a solid electrolyte layer is preferably, for example, within a range of 0.1 μm to 1000 μm, and above all, within a range of 0.1 μm to 300 μm.

2. Anode Layer Forming Step

In the present invention, anode active material layer forming step of forming an anode layer by using an anode layer composition containing an anode active material is generally performed.

The anode layer composition contains an anode active material and may further contain at least one of a solid electrolyte material and a conductive material as required.

Examples of the anode active material include a metallic active material and a carbon active material. Examples of the metallic active material include In, Al, Si and Sn. On the other hand, examples of the carbon active material include mesocarbon microbeads (MCMB), high orientation property graphite (HOPG), hard carbon, and soft carbon.

The solid electrolyte material contained in the anode layer composition is not particularly limited if it may improve Li ion conductivity; examples thereof include a sulfide-based solid electrolyte material, an oxide-based solid electrolyte material and a polymer solid electrolyte material. The solid electrolyte material may be amorphous or crystalline. A crystalline solid electrolyte material may be obtained by heat-treating an amorphous solid electrolyte material, for example. Examples of the shape of the solid electrolyte material include a particle shape, and preferably spherical shape or elliptic spherical shape, above all.

The conductive material is not particularly limited if it may improve electrical conductivity of an anode active material layer; examples thereof include acetylene black, Ketjen black and carbon fiber.

Examples of a method for forming an anode layer include a press method. The thickness of an anode layer is, for example, within a range of 0.1 µm to 1000 µm.

3. Other Steps

In the present invention, a step of disposing an anode current collector on a surface of an anode layer and a step of storing a power generating element in a battery outer case may be offered other than the above-mentioned steps. In the case where a substrate is a solid electrolyte layer, a step of disposing a cathode current collector on a surface of a cathode active material layer may be offered.

The cathode current collector is described in the section of the above-mentioned 'A. Method for producing cathode active material layer'; therefore, the description herein is omitted. On the other hand, examples of a material for the anode current collector include SUS, copper, nickel and carbon. The thickness and shape of the anode current collector are preferably selected properly in accordance with factors such as a use of an all solid lithium secondary battery. A general battery outer case of an all solid lithium secondary battery may be used for a battery outer case in the present invention; examples thereof include a battery outer case made of SUS. In the present invention, a power generating element may be formed inside an insulating ring.

Examples of the shape of an all solid lithium secondary battery obtained by the present invention include a coin shape, a laminate shape, a cylindrical shape and a rectangular shape.

C. Cathode Body

A cathode body of the present invention comprises: a substrate and a cathode active material layer formed on the above-mentioned substrate and containing $LiX_aO_b$ (X is a transition metal element of at least one kind selected from the group consisting of Co, Ni and Mn, a=0.7-1.3, and b=1.5-2.5); characterized in that the "c" axis of the above-mentioned $LiX_aO_b$ is inclined against the normal line of the above-mentioned substrate; and a surface roughness (Ra) of the above-mentioned cathode active material layer is 5 nm or less.

According to the present invention, with regard to the cathode active material layer, nucleus formation of the $LiX_aO_b$ is controlled and the "c" axis of the $LiX_aO_b$ is inclined against the normal line of the substrate, so that the resistance of the cathode active material layer may be decreased. The cathode active material layer is so favorable in flatness that a solid electrolyte layer need not be formed thickly for preventing a short circuit in being used for an all solid lithium secondary battery, and the thickness of a solid electrolyte layer may be thinned. Accordingly, an increase in battery capacity and an improvement in output characteristics may be attained in being used for an all solid lithium secondary battery.

FIG. 1B is a schematic cross-sectional view showing an example of a cathode body of the present invention. The cathode body shown in FIGS. 1A and 1B has a substrate 1 and a cathode active material layer 2b formed on the substrate 1 and containing $LiX_aO_b$. Here, not shown in the drawing, in the cathode active material layer 2b, the "c" axis of the Li $X_aO_b$ is inclined against the normal line of the substrate 1.

The substrate is described in the section of the above-mentioned 'A. Method for producing cathode active material layer'; therefore, the description herein is omitted. Other compositions of the cathode body of the present invention are described hereinafter.

1. Cathode Active Material Layer

A cathode active material layer in the present invention contains $LiX_aO_b$ (X is a transition metal element of at least one kind selected from the group consisting of Co, Ni and Mn, a=0.7-1.3, and b=1.5-2.5), in which the "c" axis of the Li $X_aO_b$ is inclined against the normal line of the substrate and a surface roughness (Ra) is 5 nm or less.

The inclination of the "c" axis of the $LiX_aO_b$ against the normal line of the substrate is not particularly limited as long as it may be such that the "c" axis of the $LiX_aO_b$ is inclined against the normal line of the substrate and the "ab" axis with low electric resistivity is arrayed so closer to the normal line direction that the resistance of a cathode active material layer may be decreased. Specifically, the inclination angle of the "c" axis of the $LiX_aO_b$ against the normal line of the substrate is preferably 30° or more, and above all, within a range of 55° to 90°. The reason therefor is that the "c" axis of the $LiX_aO_b$ may be inclined so sufficiently against the normal line of the substrate and the resistance of a cathode active material layer is decreased so sufficiently that a desired cathode active material layer may be obtained.

A value obtained by analyzing an X-ray diffraction pattern measured on the basis of X-ray diffractometry (X-ray diffraction instrument: TTR III™, manufactured by RIGAKU Corporation) may be used for the inclination angle of the "c" axis of the $LiX_aO_b$ against the normal line of the substrate.

A cathode active material layer containing $LiX_aO_b$ is preferably such that a specific plane is formed preferentially. The term 'specific plane is formed preferentially' signifies that a specific plane is in a dominant state among crystal planes. For example, in the case of $LiCoO_2$, as shown in FIG. 3, when the peaks of (101) plane and (104) plane analyzable by XRD are rendered stronger, the "c" axis of $LiCoO_2$ may be inclined more against the normal line of the substrate and the "ab" axis with low electric resistivity may be arrayed so closer to the normal line direction that the resistance of a cathode active material layer may be decreased. On the other hand, when the peak of (003) plane analyzable by XRD is rendered stronger, the "c" axis is arrayed in the normal line direction of the substrate, so that the resistance of a cathode active material layer is increased more. Therefore, in the case of $LiCoO_2$, in an XRD pattern of a cathode active material layer, the peak intensity of (101) plane or (104) plane is preferably larger than that of (003) plane, and preferably larger than the largest peak intensity among the peak intensities of other crystal planes.

In particular, with regard to a cathode active material layer containing $LiX_aO_b$, only the peak of a substantially specific plane is preferably detected in an XRD pattern. The term 'only the peak of a substantially specific plane is detected' signifies that the peak intensity of crystal planes other than a specific plane is as small as may be identified with measurement noise. For example, in the case of $LiCoO_2$, substantially only the peak of (101) plane or (104) plane is preferably detected in an XRD pattern.

The film thickness of a cathode active material layer is not particularly limited if it is a film thickness such as to allow a cathode active material layer with sufficiently low resistance, and is preferably 10 nm or more, above all, within a range of 100 nm to 50 μm, and particularly, within a range of 1 μm to 10 μm. Too thin film thickness brings a possibility of not allowing sufficient capacity. The reason therefor is that film thickness within the above-mentioned range allows a cathode active material layer with sufficient thickness and thereby allows a cathode active material layer with sufficient capacity.

A value measured on the basis of image analysis by using an electron microscope may be used for the film thickness of a cathode active material layer.

Other aspects of a cathode active material layer are described in the section of the above-mentioned 'A. Method for producing cathode active material layer'; therefore, the description herein is omitted.

The present invention is not limited to the above-mentioned embodiments. The above-mentioned embodiments are exemplification, and any is included in the technical scope of the present invention if it has substantially the same constitution as the technical idea described in the claim of the present invention and offers similar operation and effect thereto.

EXAMPLES

The present invention is described more specifically while showing examples hereinafter.

Examples 1 to 4

A cathode active material layer containing $LiCoO_2$ was formed on the following conditions.

<Film-Forming Conditions>
Film-forming method: PLD method
Apparatus: Chamber (manufactured by PASCAL CO., LTD.) KrF excimer laser (248 nm) (manufactured by Coherent GmbH)
Laser: 20 mJ, 5 Hz
Film-forming time: 1 hour
Oxygen partial pressure: 0.003 torr
Substrate: monocrystalline Pt substrate (crystal orientation: (110))
Target: $LiCoO_2$ sintered body with ϕ20 mm×5 mm (Li:Co=1.2:1.0)
Substrate temperature: refer to Table 1
<Annealing Treatment Conditions>
Atmosphere: in the air
Annealing temperature: refer to Table 1
Rate of temperature rise: 20° C./min
Retention time: 60 minutes

Comparative Examples 1 to 4

A cathode active material layer was formed in the same manner as Examples 1 to 4 except for not performing the annealing treatment.

TABLE 1

| | Substrate Temperature During Deposition (° C.) | Aerial Annealing Temperature (° C.) |
|---|---|---|
| Example 1 | RT | 500 |
| Example 2 | RT | 400 |
| Example 3 | RT | 300 |
| Example 4 | RT | 200 |
| Comparative Example 1 | 500 | Not performed |
| Comparative Example 2 | 400 | Not performed |
| Comparative Example 3 | 300 | Not performed |
| Comparative Example 4 | 200 | Not performed |

Evaluations of Examples 1 to 4 and Comparative Examples 1 to 4

Figure 6A:
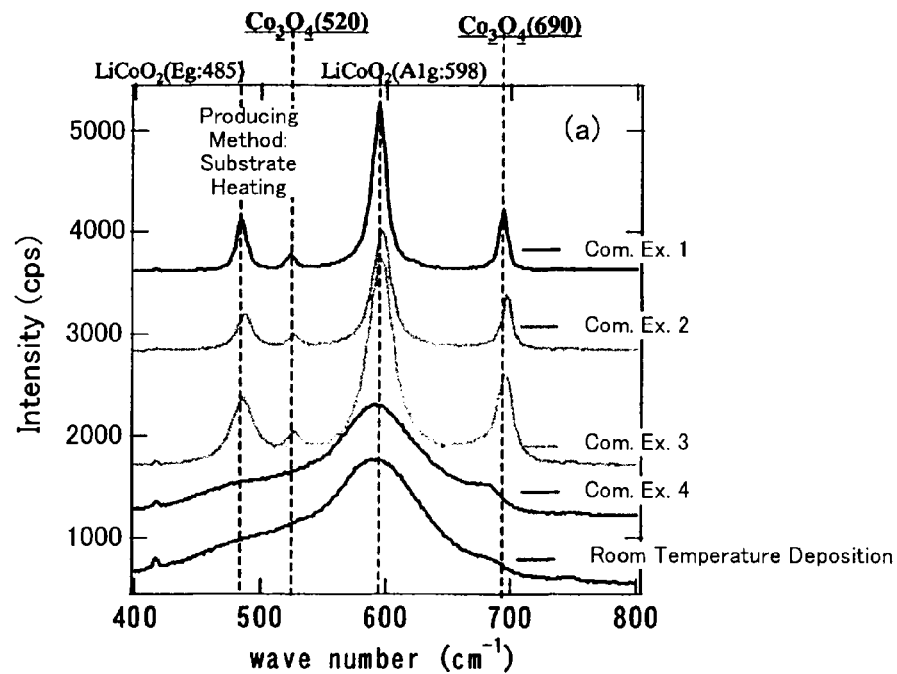
FIGS. 6A and 6B are each a Raman spectrum of the respective cathode active material layers of Examples 1 to 4 and Comparative Examples 1 to 4.
Figure 6B:
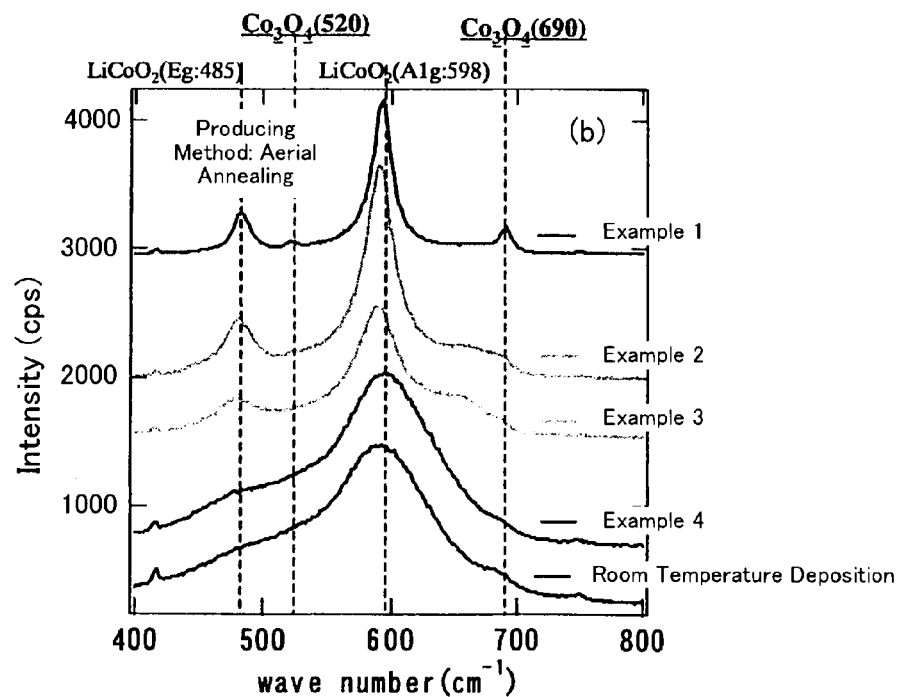

A Raman spectrum of a cathode active material layer of Comparative Examples 1 to 4 and Examples 1 to 4 is shown in FIGS. 6A and 6B, respectively. In Comparative Examples 1 to 4, $CO_3O_4$ as impurities was confirmed clearly. On the other hand, in Examples 1 to 4, a clear peak of $CO_3O_4$ as impurities did not exist in the case where annealing temperature was 400° C. or less. With regard to Examples 1 to 4 and Comparative Examples 1 to 4, when the cases where annealing temperature and substrate temperature during deposition were the same were compared, it was confirmed in Examples 1 to 4 that the production of $CO_3O_4$ as impurities might be restrained.

Figure 7:
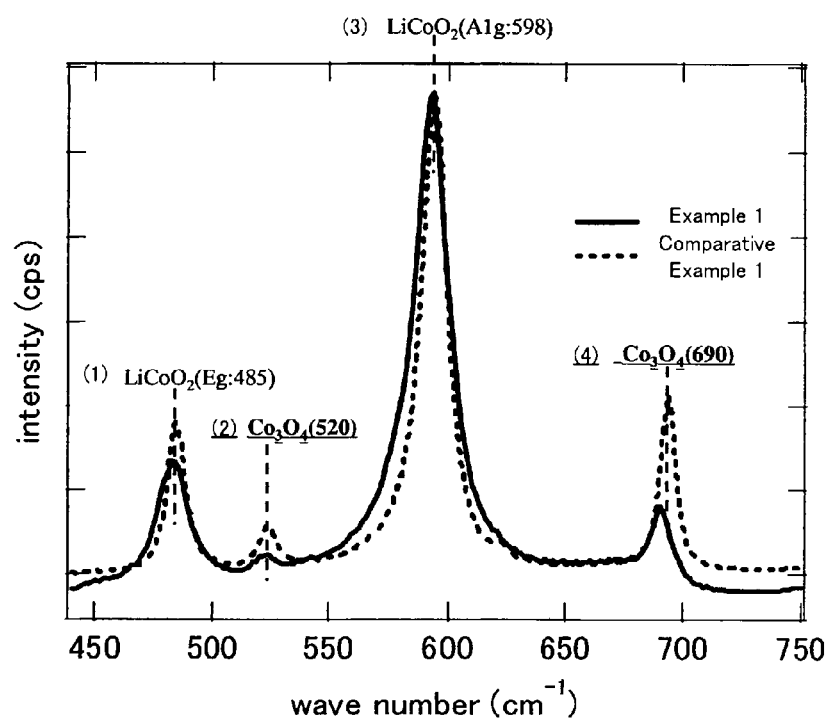
FIG. 7 is a Raman spectrum of cathode active material layers of Example 1 and Comparative Example 1.

A Raman spectrum of a cathode active material layer of Example 1 and Comparative Example 1 is shown in FIG. 7. An intensity ratio of the peaks 2 and 4 of $CO_3O_4$ to the main peak 3 of $LiCoO_2$ in FIG. 7 is shown in Table 2.

TABLE 2

| | Comparative Example 1 | Example 1 | Comparative Example 1/ Example 1 |
|---|---|---|---|
| Peak 2 of $CO_3O_4$/ main peak 3 of $LiCoO_2$ | 0.08 | 0.03 | 2.67 |
| Peak 4 of $CO_3O_4$/ main peak 3 of $LiCoO_2$ | 0.363 | 0.113 | 3.21 |

In Example 1 and Comparative Example 1, Example 1 was fewer in $CO_3O_4$ as impurities and smaller by three times or more in an intensity ratio of the peaks 2 and 4 of $CO_3O_4$ to the main peak 3 of $LiCoO_2$. It was confirmed from the above results that the present invention was effective for restraining impurities such as $CO_3O_4$ from being produced.

Through FIG. 6A, $CO_3O_4$ was easily produced in the case where substrate temperature during deposition was 300° C. or more. It was found that substrate temperature was preferably 300° C. or less. In addition, through FIG. 6B, in Examples 1 to 4, higher annealing temperature brought sharper peak of the Raman spectrum (peak half-value width became narrower). It was found that higher annealing temperature brought higher crystallinity.

Example 5

A cathode active material layer was formed in the same manner as Examples 1 to 4 except for setting annealing temperature at 700° C.

Figure 8A:
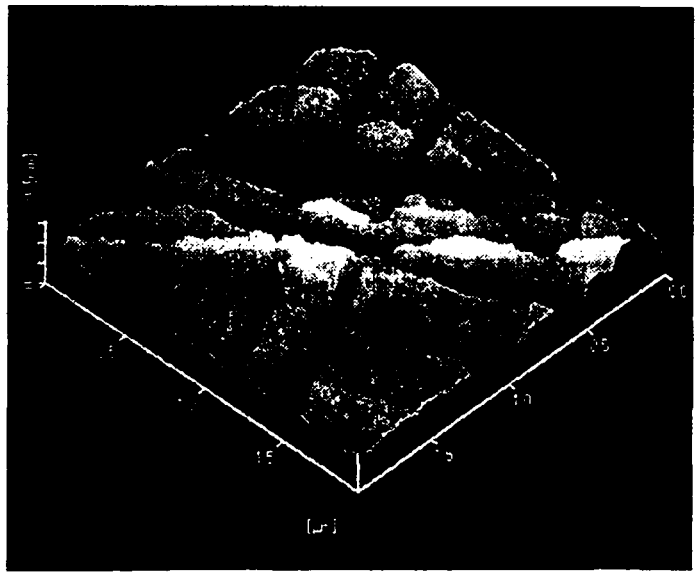
FIGS. 8A and 8B are each an AFM image of a cathode active material precursor-film (before annealing treatment) and a cathode active material layer (after annealing treatment) in Example 5.
Figure 8B:
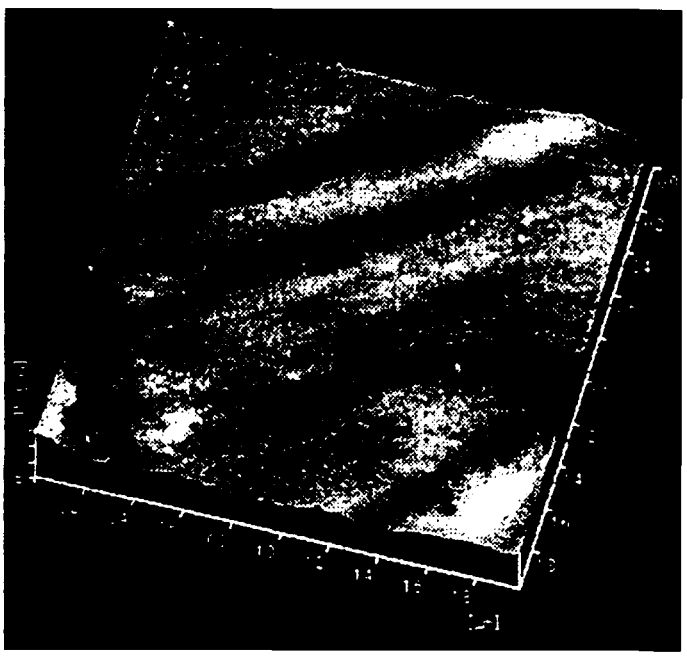

An AFM image before the annealing treatment (cathode active material precursor-film) and after the annealing treatment (cathode active material layer) is shown in FIGS. 8A and 8B, respectively. A groove observed before the annealing treatment disappeared by annealing treatment in the air at 700° C. It was confirmed that a cathode active material layer with favorable flatness was obtained by performing the annealing treatment.

Examples 6 to 9

A cathode active material layer containing $LiCoO_2$ was formed on the following conditions.
<Film-Forming Conditions>
Film-forming method: PLD method
Apparatus: Chamber (manufactured by PASCAL CO., LTD.) KrFexcimer laser (248 nm) (manufactured by Coherent GmbH)
Laser: 20 mJ, 5 Hz
Film-forming time: 1 hour
Oxygen partial pressure: 0.003 torr
Substrate: monocrystalline c-$Al_2O_3$ substrate (crystal orientation: (0001))
Target: $LiCoO_2$ sintered body with φ20 mm×5 mm (Li:Co=1.2:1.0)
Substrate temperature: refer to Table 3
<Annealing Treatment Conditions>
Atmosphere: in the air
Annealing temperature: refer to Table 3
Rate of temperature rise: 20° C./min
Retention time: 60 minutes Comparative Examples 5 to 8

A cathode active material layer was formed in the same manner as Examples 6 to 9 except for not performing the annealing treatment.

TABLE 3

|  | Substrate Temperature During Deposition (° C.) | Aerial Annealing Temperature (° C.) |
| --- | --- | --- |
| Example 6 | RT | 500 |
| Example 7 | RT | 400 |
| Example 8 | RT | 300 |
| Example 9 | RT | 200 |
| Comparative Example 5 | 500 | Not performed |
| Comparative Example 6 | 400 | Not performed |
| Comparative Example 7 | 300 | Not performed |
| Comparative Example 8 | 200 | Not performed |

Evaluations of Examples 6 to 9 and Comparative Examples 5 to 8

Figure 9:
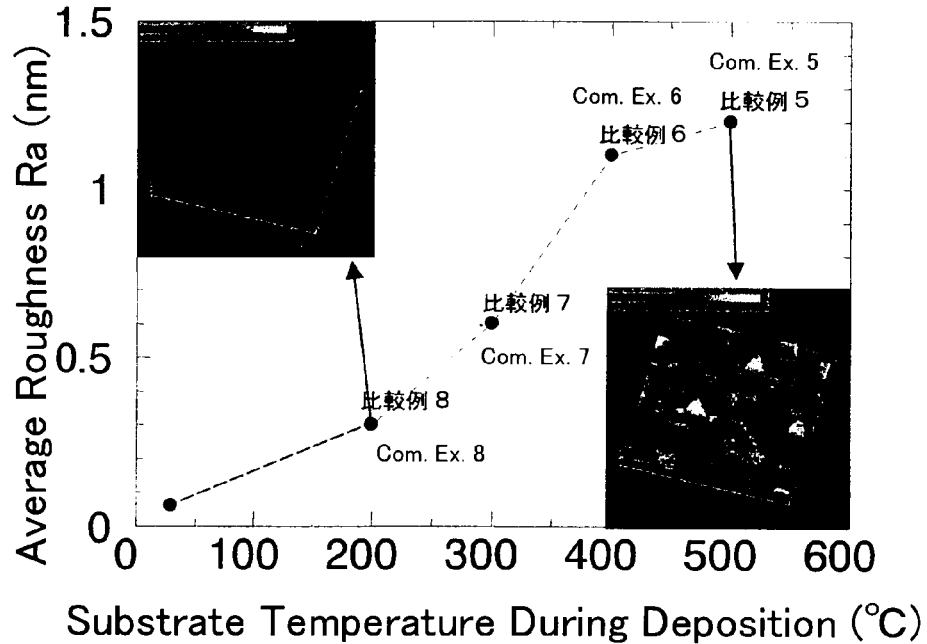
FIG. 9 is a graph showing a relation between substrate temperature during deposition and surface roughness (Ra) of a cathode active material layer of Comparative Examples 5 to 8, and an AFM image of a cathode active material layer of Comparative Examples 5 and 8.
Figure 10:
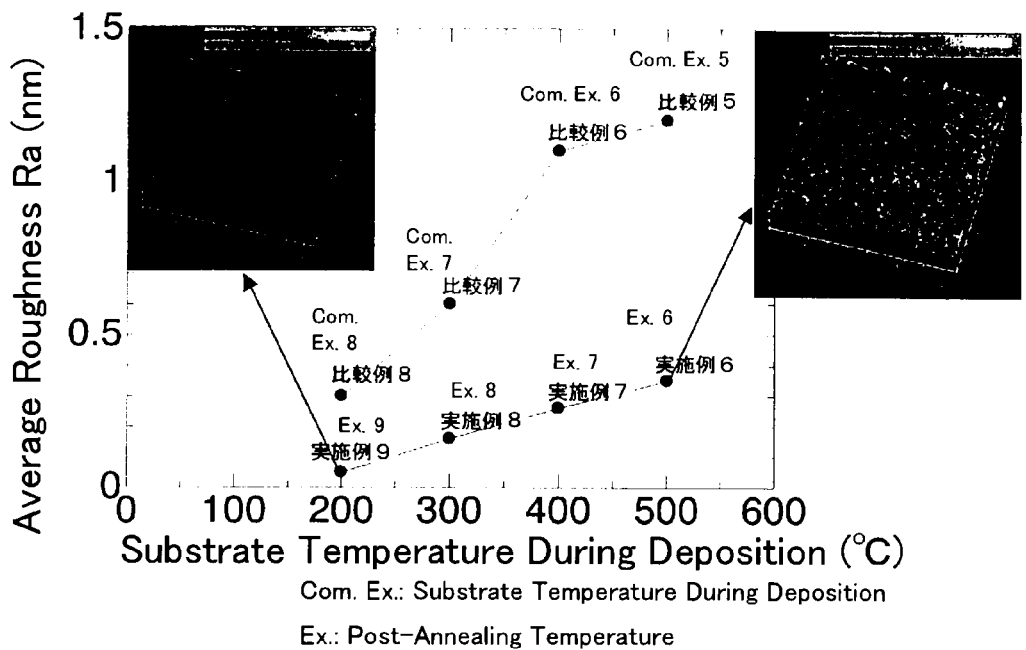
FIG. 10 is a graph showing a relation between annealing temperature and surface roughness (Ra) of a cathode active material layer of Examples 6 to 9 and a relation between substrate temperature during deposition and surface roughness (Ra) of a cathode active material layer of Comparative Examples 5 to 8, and an AFM image of a cathode active material layer of Examples 6 and 9.
Figure 11:
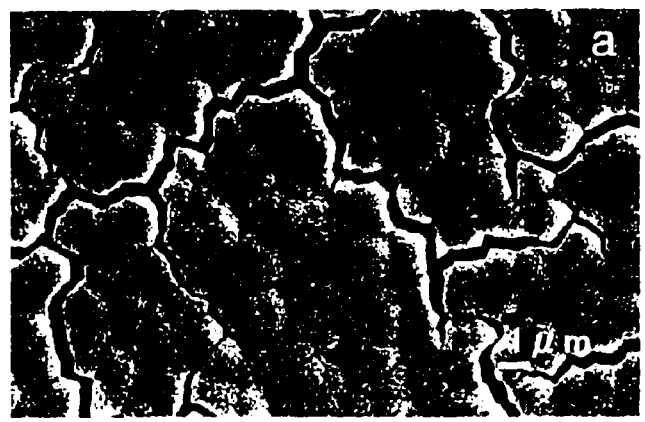
FIG. 11 is a typical SEM photograph of an $LiCoO_2$ film formed by a sputtering method.

A graph showing a relation between substrate temperature during deposition and surface flatness of a cathode active material layer of Comparative Examples 5 to 8 is shown in FIG. 9. An AFM image of a cathode active material layer of Comparative Examples 5 and 8 is also shown in FIG. 9. A graph showing a relation between annealing temperature and surface flatness of a cathode active material layer of Examples 6 to 9 and a relation between substrate temperature during deposition and surface flatness of a cathode active material layer of Comparative Examples 5 to 8 are shown in FIG. 10. An AFM image of a cathode active material layer of Examples 6 and 9 is also shown in FIG. 10.

With regard to Examples 6 to 9 and Comparative Examples 5 to 8, when the cases where annealing temperature and substrate temperature during deposition were the same were compared, it was confirmed in Examples 6 to 9 that surface flatness of a cathode active material layer was improved. Also, in Examples 6 to 9, a cathode active material layer with no cracks was obtained.

Through FIG. 9, in Comparative Examples 5 to 8, higher substrate temperature during deposition brought rougher film surface and caused more cracks. It was found that film formation at low temperature was preferable for obtaining a flat cathode active material layer with few cracks. On the other hand, when X-ray diffraction measurement was performed for a cathode active material layer of Comparative Examples 5 to 8, lower substrate temperature during deposition brought higher flatness of a cathode active material layer but lower crystallinity. That is to say, crystallinity and flatness was in a relation of a trade-off. Crystallinity was evaluated by peak half-value width of the X-ray diffraction pattern. On the contrary, in the present invention, as described above, the performance of the annealing treatment allows flatness to be improved, so that crystallinity and flatness may be compatible.

Examples 10 to 17

Cathode active material layers were formed in the same manner as Examples 6 to 9 except for setting temperature and rate of temperature rise in the annealing treatment at the conditions shown in Table 4 and performing the annealing treatment twice in Examples 14 and 15.

X-ray diffraction measurement was performed for the cathode active material layers of Examples 10 to 17, and the presence or absence of crystallization was evaluated by the peak belonging to (003) of $LiCoO_2$. The results are shown in Table 4.

TABLE 4

|  | First annealing treatment | | Second annealing treatment | | |
| --- | --- | --- | --- | --- | --- |
|  | Annealing Temp. (° C.) | Rate of Temp. rise (° C./min) | Annealing Temp. (° C.) | Rate of Temp. rise (° C./min) | Crystallization Strength |
| Example 10 | 200 | 100 | — | — | Weak |
| Example 11 | 400 | 100 | — | — | Weak |
| Example 12 | 500 | 100 | — | — | Strong |
| Example 13 | 500 | 20 | — | — | Medium |
| Example 14 | 400 | 100 | 500 | 100 | Weak |
| Example 15 | 400 | 100 | 600 | 100 | Weak |
| Example 16 | 500 | 50 | — | — | Weak |
| Example 17 | 500 | 40 | — | — | Medium |

In Examples 12, 13, 16 and 17, higher rate of temperature rise brought higher degree of crystallization, and the degree of crystallization became strong in the cases where the rate of temperature rise was 100° C./min or more. It was found that the annealing treatment was preferably rapid. It is surmised that the reason therefor is that crystallization is conceived to progress from the film surface in the annealing treatment and low rate of temperature rise causes crystallization inside the film with difficulty for the reason that crystallization on the film surface is first caused. Also, in Examples 12, 14 and 15, it was found that when an annealing treatment was performed once at comparatively low temperature, crystallization did not progress even though an annealing treatment was thereafter performed at comparatively high temperature. In addition, in Examples 10 to 12, higher annealing temperature brought higher crystallinity, and the degree of crystallization became strong in the case where annealing temperature was 500° C. or more.

Example 18

A cathode active material layer was formed in the same manner as Example 1 except for using a monocrystalline Pt substrate (crystal orientation: (111)) as the substrate.

Example 19

A cathode active material layer was formed in the same manner as Example 1 except for using a monocrystalline Au substrate (crystal orientation: (110)) as the substrate.

Example 20

A cathode active material layer was formed in the same manner as Example 1 except for using a monocrystalline Au substrate (crystal orientation: (111)) as the substrate.

Evaluations of Examples 1 and 18 to 20

When X-ray diffraction measurement was performed for a cathode active material layers of Examples 1 and 18 to 20 to analyze X-ray diffraction pattern, Pt [220] or Au [220] and LiCoO$_2$ [110] were parallel in the case of using the (110) Pt substrate (Example 1) or the (110) Au substrate (Example 19). This is conceived to be in an oriented state of LiCoO$_2$ as is exemplified in FIG. 4A. On the other hand, Pt [111] or Au [111] and LiCoO$_2$ [006] were parallel in the case of using the (111) Pt substrate (Example 18) or the (111) Au substrate (Example 20). This is conceived to be in an oriented state of LiCoO$_2$ as is exemplified in FIG. 4B. It was confirmed that the orientation direction of LiCoO$_2$ might be changed by utilizing crystal orientation of the substrate. The oriented state of LiCoO$_2$ on the (110) substrate is preferable in consideration of Li ion conductivity.

REFERENCE SIGNS LIST 1 substrate
2a cathode active material precursor-film
2b cathode active material layer
11 cathode current collector
13 solid electrolyte layer
14 anode layer
15 anode current collector
20 power generating element

The invention claimed is:

1. A method for producing a cathode active material layer, the method comprising:
   forming a cathode active material precursor-film on a substrate by a physical vapor deposition method while setting a temperature of the substrate at 300° C. or less; and
   performing an annealing treatment for the cathode active material precursor-film at a temperature equal to or more than a crystallizable temperature of LiX$_a$O$_b$,
   wherein
   the cathode active material layer is formed on the substrate and comprises the LiX$_a$O$_b$,
   X is at least one transition metal element selected from the group consisting of Co, Ni and Mn,
   a=0.7-1.3,
   b=1.5-2.5,
   a target is used in forming the cathode active material precursor-film by the physical vapor deposition method,
   in the target, Li is more excessive than a stoichiometric composition ratio between Li and X, and
   the substrate has an orientation property in a surface.

2. The method of claim 1, wherein a rate of temperature rise in the annealing treatment is 20° C./min or more.

3. The method of claim 1, wherein the cathode active material layer is formed such that a "c" axis of the LiX$_a$O$_b$ is inclined against a normal line of the substrate.

4. The method of claim 1, wherein a crystal orientation of the substrate is (110).

5. A method for producing an all solid lithium secondary battery, the method comprising forming a cathode active material layer by the method of claim 1, wherein the all solid lithium secondary battery comprises:
   the cathode active material layer;
   an anode layer; and
   a solid electrolyte layer formed between the cathode active material layer and the anode layer.

* * * * *